United States Patent
Chen et al.

(10) Patent No.: US 7,663,185 B2
(45) Date of Patent: Feb. 16, 2010

(54) FIN-FET DEVICE STRUCTURE FORMED EMPLOYING BULK SEMICONDUCTOR SUBSTRATE

(75) Inventors: Kuang-Hsin Chen, Hsin-Chu (TW); Hsun-Chih Tsao, Hsin-Chu (TW); Jhi-Cherng Lu, Taipei (TW); Chuan-Ping Hou, Yungkang (TW); Peng-Fu Hsu, Hsinchu (TW); Hung-Wei Chen, Hsinchu (TW); Di-Hong Lee, Hsin-Chu (TW)

(73) Assignee: Taiwan Semiconductor Manufacturing Co, Ltd, Hsin-Chu (TW)

( * ) Notice: Subject to any disclaimer, the term of this patent is extended or adjusted under 35 U.S.C. 154(b) by 292 days.

(21) Appl. No.: 11/441,724

(22) Filed: May 27, 2006

(65) Prior Publication Data

US 2007/0272954 A1    Nov. 29, 2007

(51) Int. Cl.
*H01L 29/76*    (2006.01)
(52) U.S. Cl. .................. 257/329; 257/330; 257/E29.13
(58) Field of Classification Search .................. 257/329, 257/330, 332, E29.13
See application file for complete search history.

(56) References Cited

U.S. PATENT DOCUMENTS

| | | | | |
|---|---|---|---|---|
| 7,141,856 B2 * | 11/2006 | Lee et al. | ...................... | 257/401 |
| 7,148,541 B2 * | 12/2006 | Park et al. | .................... | 257/347 |
| 7,153,733 B2 * | 12/2006 | Seo et al. | ..................... | 438/197 |
| 2005/0035391 A1 * | 2/2005 | Lee et al. | ..................... | 257/308 |
| 2005/0145932 A1 * | 7/2005 | Park et al. | .................... | 257/328 |
| 2005/0239252 A1 * | 10/2005 | Ahn et al. | ................... | 438/268 |
| 2006/0088967 A1 * | 4/2006 | Hsiao et al. | ................. | 438/296 |
| 2006/0160302 A1 * | 7/2006 | Kim et al. | ................... | 438/254 |
| 2008/0001187 A1 * | 1/2008 | Booth et al. | ................ | 257/288 |

* cited by examiner

*Primary Examiner*—Tuan N. Quach
(74) *Attorney, Agent, or Firm*—Tung & Associates

(57) ABSTRACT

A fin-FET device and a method for fabrication thereof both employ a bulk semiconductor substrate. A fin and an adjoining trough are formed within the bulk semiconductor substrate. The trough is partially backfilled with a deposited dielectric layer to form an exposed fin region and an unexposed fin region. A gate dielectric layer is formed upon the exposed fin region and a gate electrode is formed upon the gate dielectric layer. By employing a bulk semiconductor substrate the fin-FET device is fabricated cost effectively.

17 Claims, 2 Drawing Sheets

FIN-FET DEVICE STRUCTURE FORMED EMPLOYING BULK SEMICONDUCTOR SUBSTRATE

BACKGROUND OF THE INVENTION

1. Field of the Invention

The invention relates generally to methods for fabricating fin-FET devices within semiconductor products. More particularly, the invention relates to methods for efficiently fabricating fin-FET devices within semiconductor products.

2. Description of the Related Art

Semiconductor products typically employ field effect transistor (FET) devices as switching elements for electrical signal processing functions or electrical signal storage functions. FET devices are quite common, but as they are scaled to smaller dimensions performance difficulties are often encountered. The performance difficulties often derive from short channel effects with FET devices of diminished channel width.

In an effort to alleviate short channel effects within FET devices of diminished channel width, the use of FET devices formed employing a channel having a fin shape has been proposed. Such FET devices are known as fin-FET devices. fin-FET devices are generally fabricated employing silicon-on-insulator (SOI) semiconductor substrates. A silicon fin is defined within the silicon layer of the silicon-on-insulator (SOI) semiconductor substrate and the fin is isolated from adjacent fins by the buried insulator layer within the silicon-on-insulator (SOI) semiconductor substrate.

Although a fin-FET device may be readily fabricated employing such a silicon-on-insulator (SOI) semiconductor substrate, the use of silicon-on-insulator (SOI) semiconductor substrates, rather than bulk semiconductor substrates, generally adds considerable additional cost when fabricating a fin-FET device.

It is thus desirable to provide a method for fabricating a fin-FET device while employing a bulk semiconductor substrate. The invention is directed towards the foregoing object.

SUMMARY OF THE INVENTION

A first object of the invention is to provide a method for fabricating a fin-FET device.

A second object of the invention is to provide a method in accord with the first object of the invention, where the fin-FET device is fabricated employing a bulk semiconductor substrate.

In accord with the objects of the invention, the invention provides a fin-FET structure and a method for fabricating the fin-FET structure.

The fin-FET structure comprises a bulk semiconductor substrate having a fin and an adjoining trough formed therein. The trough is partially backfilled with a first dielectric layer to form a partially exposed fin upon which is subsequently sequentially formed a gate dielectric layer and a gate electrode.

The invention provides a method for fabricating a fin-FET device while employing a bulk semiconductor substrate.

The invention realizes the foregoing object by backfilling a trough adjoining a fin within a bulk semiconductor substrate to form an exposed fin region of the bulk semiconductor substrate separated from a remainder portion of the bulk semiconductor substrate by an unexposed fin region of the bulk semiconductor substrate. Both the exposed fin region and the unexposed fin region are formed of limited cross-sectional dimensions. A gate dielectric layer and a gate electrode are successively layered upon the exposed fin region but not the unexposed fin region to thus form a fin-FET structure. Since the unexposed fin region is formed of limited cross-sectional dimensions, the same thus serves to effectively isolate the exposed fin region from the remainder portion of the bulk semiconductor substrate. Thus, the invention provides a method for fabricating a fin-FET structure, and the resulting fin-FET structure, while employing a bulk semiconductor substrate.

BRIEF DESCRIPTION OF THE DRAWINGS

The objects, features and advantages of the invention are understood within the context of the Description of the Preferred Embodiment, as set forth below. The Description of the preferred embodiment is understood within the context of the accompanying drawings, which form a material part of this disclosure, wherein.

DESCRIPTION OF THE PREFERRED EMBODIMENT

The invention provides a method for fabricating a fin-FET device while employing a bulk semiconductor substrate.

The invention realizes the foregoing object by backfilling a trough adjoining a fin within a bulk semiconductor substrate to form an exposed fin region of the bulk semiconductor substrate separated from a remainder portion of the bulk semiconductor substrate by an unexposed fin region of the bulk semiconductor substrate. Both the exposed fin region and the unexposed fin region are formed of limited cross-sectional dimensions. A gate dielectric layer and a gate electrode are subsequently successively layered upon the exposed fin region but not the unexposed fin region to thus form a fin-FET structure. Since the unexposed fin region is formed of limited cross-sectional dimensions, the same thus serves to effectively isolate the exposed fin region from the remainder portion of the bulk semiconductor substrate. Thus, the invention provides a method for fabricating a fin-FET structure that may be employed within a fin-FET device, as well as the resulting fin-FET structure, while employing a bulk semiconductor substrate.

FIG. 1 to FIG. 8 show a series of schematic cross-sectional diagrams illustrating the results of progressive stages in fabricating a fin-FET structure in accord with a preferred embodiment of the invention.

Figure 1:
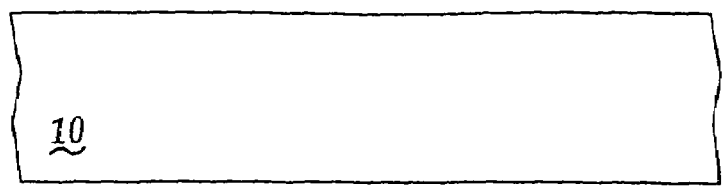
FIG. 1, FIG. 2, FIG. 3, FIG. 4, FIG. 5, FIG. 6, FIG. 7 and FIG. 8 show a series of schematic cross-sectional diagrams illustrating the results of progressive stages in fabricating a fin-FET structure in accord with a preferred embodiment of the invention.

FIG. 1 shows a bulk semiconductor substrate 10.

The invention may be practiced employing bulk semiconductor substrates of any of several varieties. They may include but are not limited to bulk silicon, bulk germanium, bulk silicon-germanium alloy and bulk III-V compound semiconductor substrates. Preferably, the invention employs a bulk silicon semiconductor substrate. The bulk silicon semiconductor substrate may have either dopant polarity, any of several dopant concentrations and any of several crystallographic orientations.

Figure 2:
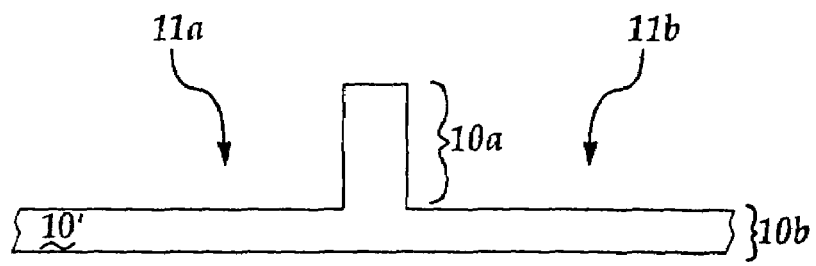

FIG. 2 shows the results of further processing of the bulk semiconductor substrate 10 of FIG. 1 to form an etched bulk semiconductor substrate 10'. The etched bulk semiconductor substrate 10' has a fin 10a connected to a remainder portion 10b of the etched bulk semiconductor substrate 10'. As is illustrated within FIG. 2, the fin 10a separates a pair of troughs 11a and 11b adjoining and adjacent the fin 10a. The fin 10a is typically formed to a fin height of from about 100 to about 10000 angstroms above the remainder portion 10b of the etched bulk semiconductor substrate 10'. The fin 10a is also typically formed of a limited linewidth from about 10 to about 200 nanometers and an extended lateral dimension (not shown) terminating at both ends to provide a pair of source/drain contact pads. The fin 10a is intended to provide a channel region within a fin-FET device.

Figure 3:
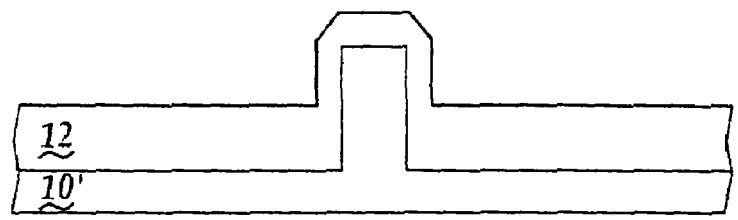

FIG. 3 shows the results of forming a blanket first dielectric layer 12 upon the etched bulk semiconductor substrate 10'. The blanket first dielectric layer 12 covers the fin 10a while partially backfilling each of the pair of troughs 11a and 11b. The blanket first dielectric layer 12 is formed employing a deposition method and preferably not a thermal oxidation method. The blanket first dielectric layer 12 may be formed from any of several dielectric materials, including generally higher dielectric constant dielectric materials (i.e., having a dielectric constant greater than about 4.0 such as silicon oxide, silicon nitride and silicon oxynitride dielectric materials) and generally lower dielectric constant dielectric materials (i.e., having a dielectric constant less than about 4.0 such as spin-on-polymer (SOP), spin-on-glass (SOG), fluorosilicate glass (FSG) and amorphous carbon dielectric materials). Preferably, the blanket first dielectric layer 12 is formed of a dielectric material (typically silicon oxide containing) deposited employing a high density plasma chemical vapor deposition (HDP-CVD) method such as to provide a nominally planar partial backfilling of the pair of troughs 11a and 11b. The HDP-CVD method also provides a tip portion of the blanket first dielectric layer 12 above the fin 10a. Typically, the blanket first dielectric layer 12 is formed to a thickness of from about 50 to about 6000 angstroms such as to partially backfill the pair of troughs 11a and 11b to a thickness of from about 40 to about 60 percent of the height of the fin 10a while completely covering the fin 10a.

Figure 4:
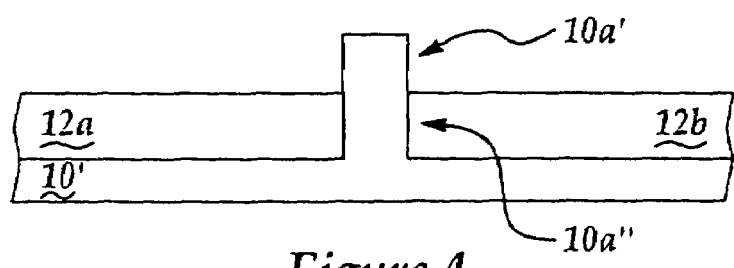

FIG. 4 illustrates the results of removing portions of the blanket first dielectric layer 12 from upon the upper surfaces and sidewalls of the fin 10a to form an exposed fin region 10a' and an unexposed fin region 10a", while simultaneously forming a pair of patterned first dielectric layers 12a and 12b partially backfilling the pair of troughs 11a and 11b. The portions of the blanket first dielectric layer 12 formed upon the upper portions of the fin 10a may be removed therefrom while employing: (1) a chemical mechanical polish (CMP) planarizing method (for removing portions of the blanket first dielectric layer 12 from upon the top of the fin 10a), followed by; (2) a wet chemical etch method (for removing portions of the blanket first dielectric layer 12 from upon the sidewalls of the fin 10a). Within the resulting semiconductor product as illustrated in FIG. 4, the exposed fin region 10a' typically extends for about 50 to about 6000 angstroms above the pair of patterned first dielectric layers 12a and 12b, and the unexposed fin region 10a" typically extends for about 50 to about 6000 angstroms sidewall covered by the pair of patterned first dielectric layers 12a and 12b.

Figure 5:
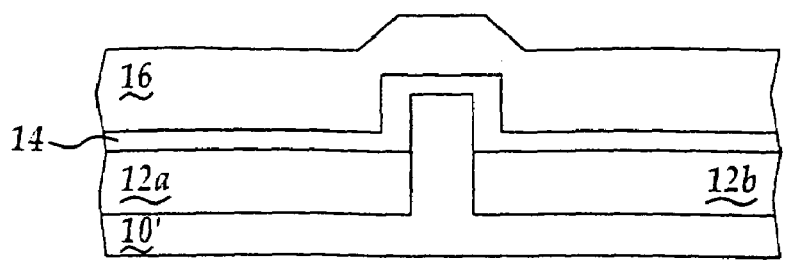

FIG. 5 shows a blanket stop layer 14 formed upon exposed portions of the pair of patterned first dielectric layers 12a and 12b, as well as the exposed fin region 10a'. FIG. 5 also shows a blanket second dielectric layer 16 formed upon the blanket stop layer 14.

The blanket stop layer 14 may be formed from any of several stop materials having stop properties with respect to the blanket second dielectric layer 16. The blanket second dielectric layer 16 may be formed from any of several dielectric materials as are employed for forming the blanket first dielectric layer 12. Typically, the blanket stop layer 14 is formed of a silicon nitride stop material formed to a thickness of from about 100 to about 1000 angstroms. Typically, the blanket second dielectric layer 16 is formed to a thickness of from about 2500 to about 10000 angstroms.

Figure 6:
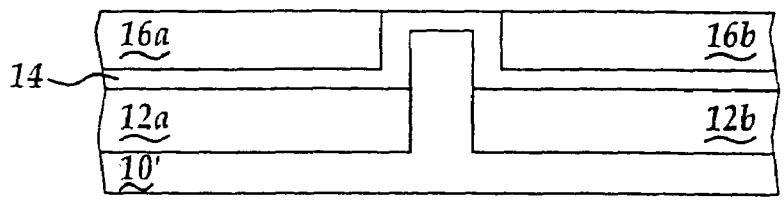

FIG. 6 shows the results of planarizing the blanket second dielectric layer 16 to form a pair of patterned second dielectric layers 16a and 16b, while employing the blanket stop layer 14 as a planarizing stop layer. Such planarizing may be effected while employing planarizing methods as are conventional in the art, in particular such as chemical mechanical polish (CMP) planarizing methods.

Figure 7:
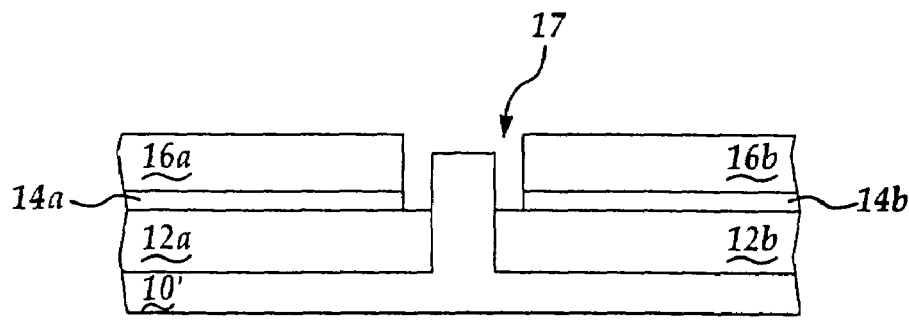

FIG. 7 shows the results of stripping a portion of the blanket stop layer 14 from upon the exposed fin region 10a' to thus form a pair of patterned stop layers 14a and 14b and an aperture 17 separating the pair of patterned stop layers 14a and 14b and the pair of patterned second dielectric layers 16a and 16b from the exposed fin region 10a'. The portion of the blanket stop layer 14 may be removed employing etch methods as are otherwise generally conventional in the art. A phosphoric acid etch method may be employed when the blanket stop layer 14 is formed of a silicon nitride or silicon oxynitride material, and the pair of patterned second dielectric layers 16a and 16b is formed of a silicon oxide dielectric material.

Figure 8:
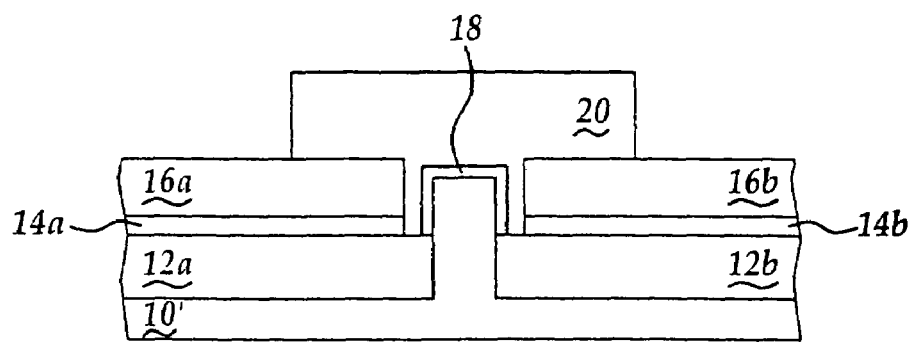

FIG. 8 shows the results of forming a gate dielectric layer 18 upon the exposed fin region 10a. The gate dielectric layer 18 partially fills the aperture 17 between the exposed fin region 10a and the pair of patterned stop layers 14a and 14b, as well as the pair of patterned second dielectric layers 16a and 16b. The gate dielectric layer 18 may be formed employing methods and materials as are otherwise conventional in the semiconductor product fabrication art. Such methods will typically include thermal oxidation methods to form the gate dielectric layer 18 of a silicon oxide material.

FIG. 8 also shows a gate electrode 20 formed upon the gate dielectric layer 18. The gate electrode 20 bridges to the pair of patterned second dielectric layers 16a and 16b, while completely filling the aperture 17 that separates the exposed fin region 10a' from the pair of patterned stop layers 14a and 14b and the pair of patterned second dielectric layers 16a and 16b. The gate electrode 20 may be formed employing methods and materials as are conventional in the semiconductor product fabrication art. Typically, the gate electrode 20 is formed of a doped polysilicon (having a dopant concentration of greater than about 1E20 dopant atoms per cubic centimeter) or polycide (doped polysilicon/metal silicide stack) gate electrode material. As is understood by a person skilled in the art, since the invention employs the pair of patterned second dielectric layers 16a and 16b as nominally planarizing layers, the gate electrode 20 may be patterned from a nominally planar blanket gate electrode material layer. This is advantageous since it provides more accurate patterning than of a corresponding blanket gate electrode material layer formed topographically upon a topographic feature.

FIG. 8 shows a schematic cross-sectional diagram of a fin-FET structure in accord with a preferred embodiment of the invention. The fin-FET structure is formed employing a bulk semiconductor substrate having a fin and an adjoining trough formed therein. The trough is partially backfilled with a dielectric layer to form an unexposed fin region and an exposed fin region from the fin. A gate dielectric layer is formed upon the exposed fin region (but not the unexposed fin region) and a gate electrode is formed upon the gate dielectric layer. The unexposed fin region is of sufficient height and limited cross-sectional dimensions such that it assists in providing adequate isolation of the exposed fin region from a remainder portion of the bulk semiconductor substrate. Thus, the invention provides a fin-FET structure and a method for fabricating the same that employs a bulk semiconductor substrate.

The preferred embodiment of the invention is illustrative of the invention rather than limiting of the invention. Revisions and modifications may be made to methods, materials, structures and dimensions in accord with the preferred embodiment of the invention while still providing an embodiment in accord with the invention, further in accord with the accompanying claims.

What is claimed is:

1. A fin-FET structure comprising:
   a bulk semiconductor substrate having a fin and an adjoining trough wherein said fin consists of a single width;
   a first dielectric layer filling the trough to a first height, said first dielectric layer being a substantially planar layer directly contacting the fin to provide an exposed fin region above said first height and an unexposed fin region below said first height;
   a second dielectric layer over the first dielectric layer such as to define an aperture, said aperture comprising a apace extending horizontally between the second dielectric layer and a sidewall of the exposed fin region;
   a gate dielectric layer upon the exposed fin region extending to said first dielectric layer and partially filling the aperture, said gate dielectric layer not upon said unexposed fin region; and
   a gate electrode upon the gate dielectric layer and completely filling the aperture.

2. The fin-FET structure of claim 1 wherein the bulk semiconductor substrate is a bulk silicon semiconductor substrate.

3. The fin-FET structure of claim 1 wherein the fin has a height of from about 100 to about 10000 angstroms.

4. The fin-FET structure of claim 1 wherein the exposed fin region has a height of from about 50 to about 6000 angstroms and the unexposed fin region has a height of from about 50 to about 6000 angstroms.

5. The fin-FET structure of claim 1 further comprising a stop layer interposed between the first dielectric layer and the second dielectric layer, said space extending horizontally between said sidewall of the exposed fin region and the stop layer.

6. The fin-FET structure of claim 5 wherein the stop layer has a thickness of from about 100 to about 1000 angstroms.

7. The fin-FET structure of claim 5 wherein the stop layer comprises a silicon nitride material and each of the first dielectric layer and the second dielectric layer comprises a silicon oxide material.

8. A fin-FET structure comprising:
   a bulk semiconductor substrate having a fin and an adjoining trough wherein said fin consists of a single width;
   a first dielectric layer filling the trough to a first height and contacting the fin to provide an exposed fin region above said first height and an unexposed fin region below said first height;
   a second dielectric layer over the first dielectric layer such as to define an aperture, said aperture comprising a space extending horizontally between the second dielectric layer and a sidewall of the exposed fin region;
   a stop layer interposed between the first dielectric layer and the second dielectric layer, said space extending horizontally between said sidewall of the exposed fin region and the stop layer;
   a gate dielectric layer upon the exposed fin region extending to said first dielectric layer, said gate dielectric layer not upon the unexposed fin region; and
   a gate electrode upon the gate dielectric layer and completely filling the aperture.

9. The fin-FET structure of claim 8 wherein the bulk semiconductor substrate is a bulk silicon semiconductor substrate.

10. The fin-FET structure of claim 8 wherein the fin has a height of from about 100 to about 10000 angstroms.

11. The fin-FET structure of claim 8 wherein the exposed fin region has a height of from about 50 to about 6000 angstroms and the unexposed fin region has a height of from about 50 to about 6000 angstroms.

12. The fin-FET structure of claim 8 wherein the stop layer has a thickness of from about 100 to about 1000 angstroms.

13. The fin-FET structure of claim 8 wherein the stop layer comprises a silicon nitride material and each of the first dielectric layer and the second dielectric layer comprises a silicon oxide material.

14. A fin-FET structure comprising:
   a bulk semiconductor substrate having a fin and an adjoining trough wherein said fin consists of a single width;
   said fin has a height of from about 100 to about 10,000 angstroms;
   a first dielectric layer filling the trough to a first height, said first dielectric layer is a substantially planar layer directly contacting the fin to provide an exposed fin region above said first height and an unexposed fin region below said first height;
   a second dielectric layer over the first dielectric layer such as to define an aperture, said aperture comprising a space extending horizontally between the second dielectric layer and a sidewall of the exposed fin region;
   a gate dielectric layer upon the exposed fin region extending to said first dielectric layer, said gate dielectric layer partially filling the aperture, said gate dielectric layer not upon said unexposed fin region; and
   a gate electrode upon the gate dielectric layer and completely filling the aperture.

15. The fin-FET structure of claim 14 wherein the bulk semiconductor substrate is a bulk silicon semiconductor substrate.

16. The fin-FET structure of claim 14 further comprising a stop layer interposed between the first dielectric layer and the second dielectric layer, said space extending horizontally between said sidewall of the exposed fin region and the stop layer.

17. The fin-FET structure of claim 16 wherein the stop layer has a thickness of from about 100 to about 1000 angstroms.

* * * * *